United States Patent [19]

McNamara et al.

[11] Patent Number: 5,966,417
[45] Date of Patent: Oct. 12, 1999

[54] CYCLE ALIGNMENT CIRCUIT FOR MULTICYCLE TIME SYSTEMS

[75] Inventors: Timothy Gerard McNamara, Fishkill; Paul D. Muench, Poughkeepsie, both of N.Y.

[73] Assignee: International Business Machines Corporation, Armonk, N.Y.

[21] Appl. No.: 08/942,844

[22] Filed: Oct. 2, 1997

[51] Int. Cl.[6] ............................................ H03D 3/24
[52] U.S. Cl. .................. 375/376; 713/500; 713/503; 714/700; 327/150; 327/152
[58] Field of Search .................. 375/376, 373; 327/144, 147, 150, 152, 159; 713/500, 503; 714/700

[56] References Cited

U.S. PATENT DOCUMENTS

| | | | |
|---|---|---|---|
| 4,677,614 | 6/1987 | Circo | 370/86 |
| 5,003,559 | 3/1991 | Kanai et al. | 375/109 |
| 5,164,619 | 11/1992 | Luebs | 307/480 |
| 5,267,267 | 11/1993 | Kazawa et al. | 375/20 |
| 5,307,381 | 4/1994 | Ahuja | 375/107 |
| 5,319,680 | 6/1994 | Port et al. | 375/119 |
| 5,394,443 | 2/1995 | Byers et al. | 375/371 |
| 5,432,823 | 7/1995 | Gasbarro et al. | 375/356 |
| 5,457,718 | 10/1995 | Anderson et al. | 375/373 |
| 5,515,403 | 5/1996 | Sloan et al. | 375/371 |
| 5,579,352 | 11/1996 | Llewellyn | 375/376 |

Primary Examiner—Stephen Chin
Assistant Examiner—Mohammad Ghayour
Attorney, Agent, or Firm—Lynn L. Augspurger

[57] ABSTRACT

A chip-to-chip Cycle Alignment Circuit is implemented on the CP chip with a phased lock loop so that a chip knows what is the cycle of a connected chip. Once the PLL is locked, the timing relationship is developed between a reference oscillator and the 3.5 ns on-chip clock which clocks three latches (latch 1,2,3). The Cycle Alignment Circuit has a first part for a rising edge detecting clock chopper and the second part for a self resetting toggle latch. The rising edge detecting clock chopper works by detecting the reference oscillator's rising edge after it has gone through a small delay. The purpose of this delay is to ensure that a latch 1 detects the rising edge on the second 3.5 ns cycle after the reference oscillator rises. A latch 2 is then used to generate a one (3.5 ns) cycle pulse at point that starts on the second 3.5 ns cycle and ends on the third 3.5 ns cycle. The pulse that is produced at that point forces a latch 3 to be reset to a 1 at the beginning of cycle 3. Once the pulse at that point goes away, latch 3 simply toggles every 3.5 ns cycle. This operation will be repeated as spaced times when the reference oscillator rises. Every successive spaced time the pulse at that point is generated, the other leg of the OR gate feeding latch 3 will also be high so the toggle function of latch 3 will be preserved. This circuit can easily be used to align chips with cycle time differences of two, as well as those other than a factor of two.

8 Claims, 2 Drawing Sheets

CYCLE ALIGNMENT CIRCUIT FOR MULTICYCLE TIME SYSTEMS

FIELD OF THE INVENTION

This invention is related to computers and computer systems and in particular to cycle alignment circuits for multicycle time systems using phased locked loops (PPLs)

BACKGROUND OF THE INVENTION

In computer systems today, ranging from PC's to mainframes, there are many chips that operate at different clock frequencies. For example the CPU chip usually operates at 2x, 3x or 4x the frequency of the other chips that communicate to it. The reason for this is that the communication between chips on a card or board can not support the faster cycle time that the CPU chip can operate internally. Usually a PLL (Phase Locked Loop) or some other frequency multiplication circuit is used to generate the faster frequency clock from the slower system clock that is distributed to each chip on the board or card. In order for these chips to synchronously communicate with each other, they MUST know the cycle time relationship between their clocks and the clocks on the chips that they are communicating to. Simply stated, the problem Is how do chips that operate at different clock frequencies that are multiplies of each other, know the cycle time relationship between their clocks?

SUMMARY OF THE INVENTION

Our invention provides a chip alignment circuit which is part of a chip circuit for those computer systems having chips that operate at different clock frequencies and need to communicate. The alignment circuit provides a toggle signal which will rise at the beginning of the internal clock signal of other chips to which the chip circuit needs to communicate. Thus the chip output of the alignment circuit is now used as the signal to indicate which CP internal clock cycle is aligned with the internal clock cycle cycle on all the other chips.

Our chip circuit uses a chip's reference oscillator input for providing a reference signal. A phased lock loop receives the reference oscillator's signal and determines an internal clock cycle time and locks the chip cycle on the determined internal clock cycle time. The chip has a cycle alignment circuit for receiving the reference oscillator's signal and providing a small delay coupled to a first latch whose output is coupled to a second latch and to an inverter. The output of the second latch and the output of said inverter are inputs to an NOR gate driving a self resetting counter functioning as a self resetting toggle whose output indicates at which cycle the chip having said alignment circuit thereon is aligned with the cycle of other chips so that said chips that operate at different clock frequencies communicate synchronously with each other knowing the cycle time relationship between their clocks and the clocks on the chips that they are communicating to.

These and other improvements are set forth in the following detailed description. For a better understanding of the invention with advantages and features, refer to the description and to the drawings.

(Note: For convenience of illustration, FIGURES may be separated in parts and as a convention we place the top of the FIGURE as the first sheet, with subsequent sheets proceeding down and across when viewing the FIGURE, in the event that multiple sheets are used.)

DETAILED DESCRIPTION OF THE INVENTION

Before considering our preferred embodiments In detail, it may be worthwhile to illustrate, by way of example, to pick a planned machine under development when this invention was conceived which will be used to illustrate this problem further.

One method that could be employed for communicating the cycle time relationship between chips is is to have one of the chips (usually the slower frequency chip) send a "synchronization" signal to the other chips. This "synchronization" signal indicates the start of the slower chip's clock cycle and can be used by the faster chip to determine when it should receive and launch new data/controls for off-chip communication.

This "synchronization" signal must be timed to arrive at the correct cycle time on the faster chip and is therefore a very critical signal since its transition can only occur between two successive clock cycles of the faster chip. This solution was in an original design proposal for the planned machine.

Figure 1:
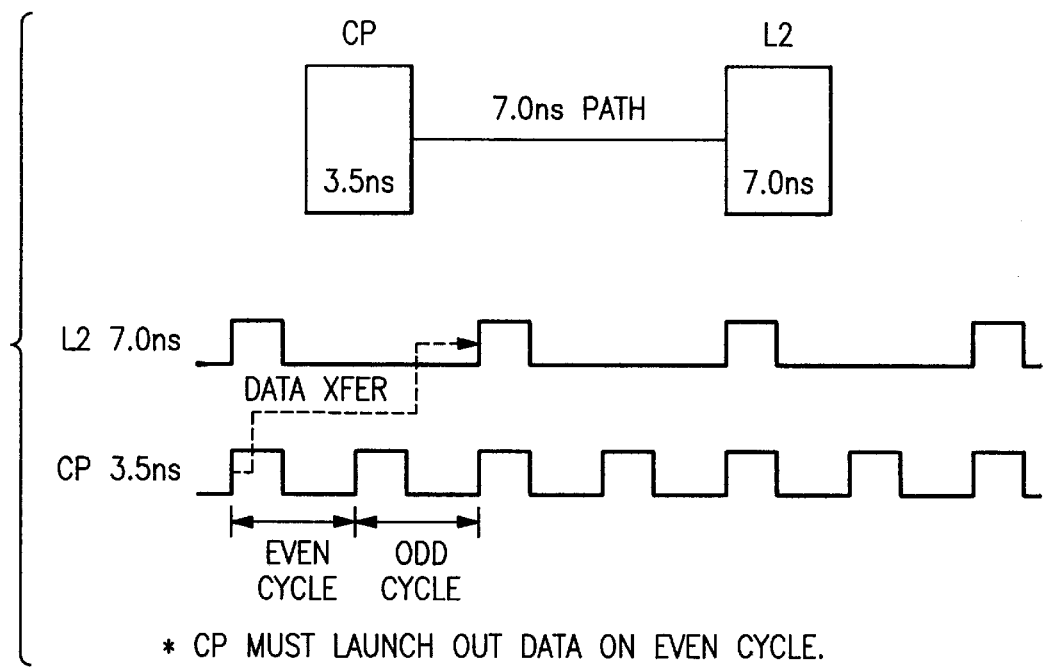
FIG. 1 shows schematically an overview of the preferred embodiment and particularly shows a chip to cache (L2) path and a timing diagram for multi-cycle time communication.

Turning now to our FIG. 1 which illustrates a timing diagram for multi-cycle time communication. The CPU chip CP in FIG. 1 operates at an internal frequency that is two times as fast as all other chips on the multi-chip module MCM in the computer system. For example, the planned machine the CPU operates at 3.5 ns cycle time while the other chips, illustrated by the L2 chip in FIG. 1, operate at 7.0 ns cycle time.

All communication between chips occurs at the slower chips frequency of 7.0 ns. The CPU chip must know which one of its 3.5 ns cycles is aligned with the beginning of the 7.0 ns cycle of the chip that it communicates to since it needs a full 7.0 ns cycle to transfer data and/or control signals. As illustrated in FIG. 1, when the CPU chip launches out data to the L2 chip it must start the launch of data on the cycle that is aligned with the L2 chip's 7.0 ns cycle time (the EVEN cycle in FIG. 1). The CP must hold that data stable during the ODD cycle to ensure the data is transferred properly to the L2 chip. The problem which we have solved allows a CPU chip to know which one of its cycles is aligned with the start of the L2 chip's cycle, i.e. which is an EVEN cycle and which is an ODD cycle?

Figure 2:
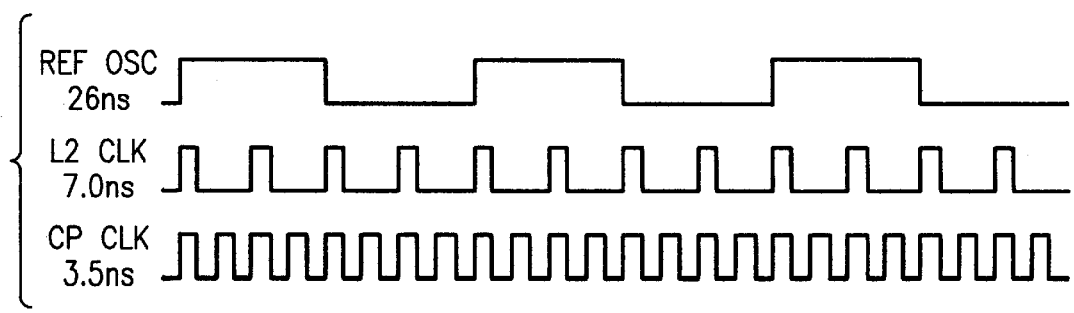
FIG. 2 shows schematically an overview of the preferred embodiment PLL timing relationships.

The solution that will now be described with reference to FIG. 2 which takes advantage of the fact that a PLL is used to multiply the frequency of the incoming reference clock to generate the 2x cycle time difference between the planned CP chip and all other chips in the system, illustrated by the L2 chip. For the planned machine the CP chip is operating at a cycle time of 3.5 ns (286 Mhz) while all other chips operate at a 7.0 ns (143 Mhz) cycle time. All communications between chips are at the slower 7.0 ns cycle time. Each chip in the system has a PLL which receives a 28.0 ns (35.7 Mhz) clock signal as its reference. The PLL located on the CP chip multiplies the reference clock frequency by a factor of 8 to get an internal clock cycle time of 3.5 ns, while the PLL located on the other chips multiplies the same reference clock frequency by a factor of 4 to get an Internal clock cycle time of 7.0 ns. FIG. 2 below shows the timing relationship between they reference clock and the 7.0 ns and 3.5 ns clocks once the PLLs are locked. Note that when the PLLs are locked, the 7.0 ns and 3.5 ns clock's rising edges are aligned with the reference clock's rising edge.

Figure 3:
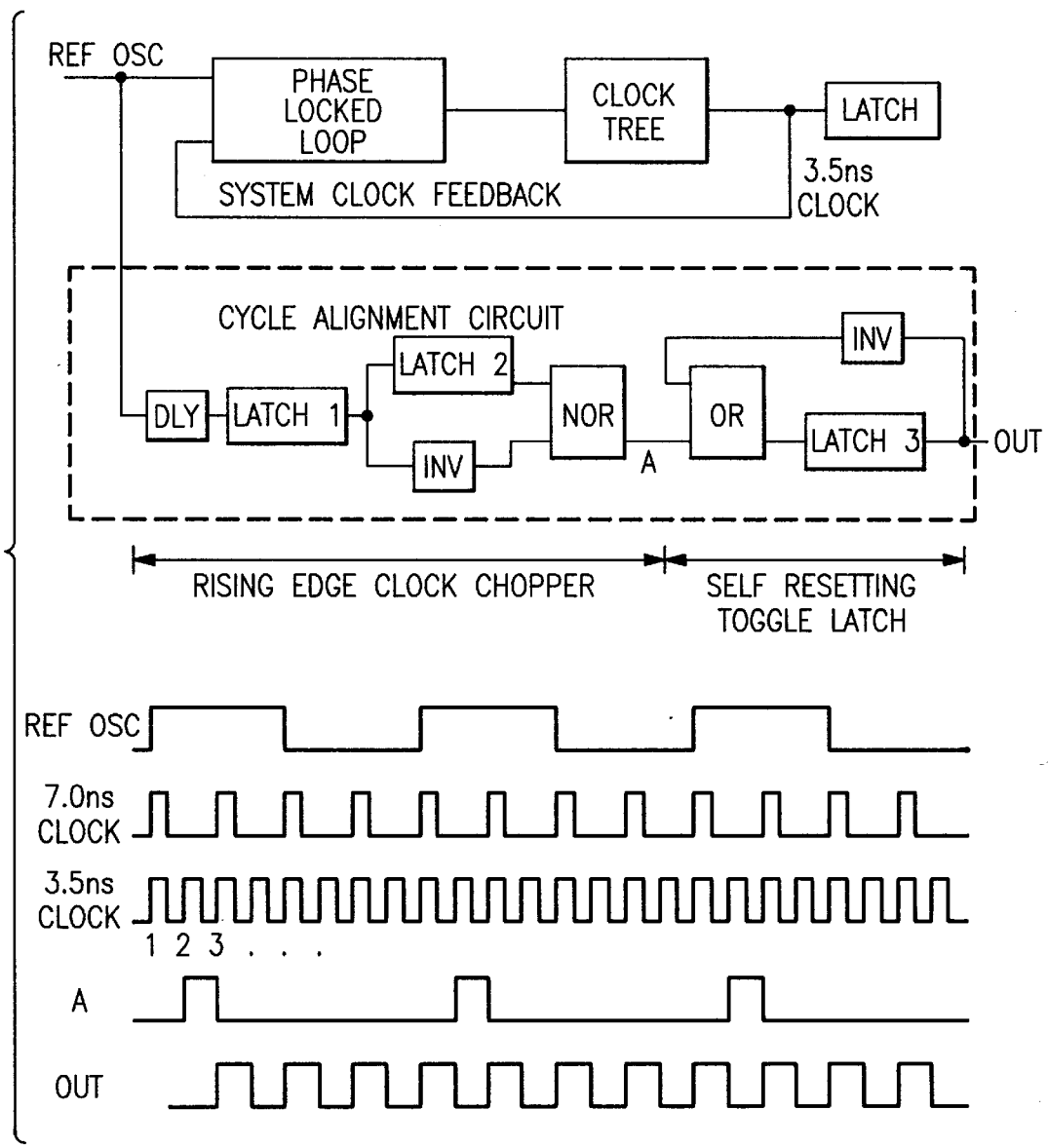
FIG. 3 shows schematically in more detail the preferred embodiment with our preferred PLL based cycle alignment circuit and timing relationships.

Our cycle alignment circuit being disclosed takes advantage of the known clock relationship (shown in FIG. 2) that is produced by the PLL based design. FIG. 3 shows the Cycle Alignment Circuit that is implemented on the CP chip and a description of the operation of the circuit now follows. Once the PLL is locked, the timing relationship between the reference oscillator and the 3.5 ns on-chip clock is shown in FIG. 3. Note that the three latches (latch 1,2,3) in FIG. 3 are all clocked with the 3.5 ns clock. The Cycle Alignment Circuit consists of two parts, the first part is a rising edge detecting clock chopper and the second part is a self resetting toggle latch. The rising edge detecting clock chopper works by detecting the reference oscillator's rising edge after it has gone through a small delay (DLY in FIG. 3). The purpose of this delay is to ensure that Latch 1 detects the rising edge on the second 3.5 ns cycle after the reference oscillator rises. Latch 2 is then used to generate a one (3.5 ns) cycle pulse at point A in FIG. 3 that starts on the second 3.5 ns cycle and ends on the third 3.5 ns cycle. The pulse that is produced at point A forces latch 3 to be reset to a 1 at the beginning of cycle 3. Once the pulse at point A goes away, latch 3 simply toggles every 3.5 ns cycle. This operation will be repeated every 28 ns when the reference oscillator rises. Every successive time the pulse at point A is generated, the other leg of the OR gate feeding latch 3 will also be high so the toggle function of latch 3 will be preserved.

As shown In FIG. 3 latch 3 will rise at the beginning of the 7.0 ns cycle on the L2 chip. Thus the output of latch 3 is now used as the signal to indicate which 3.5 ns CP cycle is aligned with the 7.0 ns cycle on all the other chips. Generally latch 3's output is used as the hold control signal for the input and output latches on the CP chip. Note that the toggle latch can easily be replaced with some other counter if some other relationship besides a factor of two is required.

The proposed solution is better because it eliminates the need to send a synchronization signal from the slower chip to the faster chip. This synchronization signal would be the most critically timed signal on the entire MCM and require a precise arrival time to occur in the faster chips cycle time. For the planned project this means that this synchronization signal would have to hit a 3.5 ns window.

As system clock frequencies continue to increase, it is becoming very difficult and in some cases it's not possible to position the "synchronization" signal in the faster chips cycle time. In fact on the planned program we could not position the "synchronization" signal from the L2 chip to the CP chip in such a way that would make this work independent of cycle time. In addition, the tolerances associated with the off-chip nets and the chip-to-chip clocks skew were larger enough that meeting the 3.5 ns window under all conditions was not possible. The solution proposed saves I/O's and eliminates the synchronization signal as the most critically timed signal in the system.

This solution can easily be used in an alternative embodiment to align chips with cycle time differences other than a factor of two. In fact the chip will allow logic running at 7.0 ns to communicate to logic running at 10.5 ns. Since the alignment circuit only effects the chip that has the different clock frequencies, there is no impact on the designs of the other chips and/or packages. This invention allows for complete backward compatibility with existing designs.

As microprocessor based systems continue to run at faster clock frequencies, the use of PLL's will increase. The proposed solution would be advantageous to any system designers that utilize PLLs.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A chip circuit for computer systems having chips that operate at different clock frequencies and need to communicate, comprising:

a chip reference oscillator input for providing a reference oscillator's signal; and a phased lock loop for receiving said reference oscillator's signal and for determining with said reference oscillator an internal clock cycle time and for locking the determined internal clock cycle time, a cycle alignment circuit thereon for receiving the reference oscillator's signal and providing a small delay coupled to a first latch whose output is coupled to a second latch and to an inverter, the output of said second latch and the output of said inverter being inputs to a NOR gate driving a self resetting counter functioning as a self resetting toggle whose output indicates at which cycle said chip having said alignment circuit thereon is aligned with the cycle of other chips so that said chips that operate at different clock frequencies communicate synchronously with each other knowing the cycle time relationship between their clocks and the clocks on the chips that they are communicating to.

2. A chip circuit for computer systems having a cycle alignment circuit according to claim 1, wherein said first latch, said second latch, and a third self resetting toggle in the form of a third latch are all clocked at said internal clock cycle time.

3. A chip circuit for computer systems having a cycle alignment circuit according to claim 2, wherein said first and said second latches form part of said cycle alignment circuit which functions as a rising edge detecting clock chopper after said reference oscillator's signal has had a small delay to ensure that said first latch detects the rising edge on the second internal clock cycle time after the reference oscillator rises.

4. A chip circuit for computer systems having a cycle alignment circuit according to claim 3, wherein after the second cycle after the reference oscillator rises the second latch generates a one cycle pulse at the point of output of said rising edge detecting clock chopper which pulse starts on the second internal clock time cycle and ends on the third internal clock time cycle.

5. A chip circuit for computer systems having a cycle alignment circuit according to claim 4, wherein said one cycle pulse that is produced forces said third self resetting toggle latch to be reset at the beginning of a third internal clock cycle, so that once the said one cycle pulse goes away said third self resetting toggle latch toggles every internal clock time cycle.

6. A chip circuit for computer systems having a cycle alignment circuit according to claim 5, wherein wherein the toggle operation is repeated regularly at periods of time when the reference oscillator rises, such that every successive time the one cycle pulse is generated, the other leg of a OR gate feeding said third self resetting toggle latch will also be high so the toggle function of third toggle latch will be preserved.

7. A chip circuit for computer systems having a cycle alignment circuit according to claim 1, wherein the output of self resetting toggle is now used as a signal to indicate which chip cycle is aligned with the cycle time on all the other chips.

8. A chip circuit for computer systems having a cycle alignment circuit according to claim 7, wherein said self resetting toggle's output is used as a hold control signal for said first latch and the output toggle of said chip.

\* \* \* \* \*